(12) United States Patent
Baumgarten et al.

(10) Patent No.: US 11,810,805 B2
(45) Date of Patent: Nov. 7, 2023

(54) PREVENTION OF CONTAMINATION OF SUBSTRATES DURING GAS PURGING

(71) Applicant: Applied Materials, Inc., Santa Clara, CA (US)

(72) Inventors: Douglas Brian Baumgarten, Round Rock, TX (US); Russell Kaplan, Sunnyvale, CA (US); Amitabh Puri, San Jose, CA (US); Paul B. Reuter, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 500 days.

(21) Appl. No.: 16/946,872

(22) Filed: Jul. 9, 2020

(65) Prior Publication Data

US 2022/0010427 A1    Jan. 13, 2022

(51) Int. Cl.
*H01L 21/673* (2006.01)
*H01L 21/67* (2006.01)
*H01L 21/677* (2006.01)
*C23C 16/54* (2006.01)
*C23C 16/458* (2006.01)
*C23C 16/44* (2006.01)
*C23C 16/52* (2006.01)
*C23C 16/455* (2006.01)

(52) U.S. Cl.
CPC ........ *H01L 21/67389* (2013.01); *C23C 16/54* (2013.01); *H01L 21/67242* (2013.01); *H01L 21/67772* (2013.01); *C23C 16/4408* (2013.01); *C23C 16/458* (2013.01); *C23C 16/45563* (2013.01); *C23C 16/52* (2013.01); *H01L 21/67775* (2013.01); *Y10T 137/0402* (2015.04)

(58) Field of Classification Search
CPC ......... Y10T 137/0402; H01L 21/67389; H01L 21/67242; H01L 21/67772; H01L 21/67775; C23C 16/4408; C23C 16/45563; C23C 16/458; C23C 16/52; C23C 16/54
USPC ...................................................... 137/15.01
See application file for complete search history.

(56) References Cited

U.S. PATENT DOCUMENTS

| 5,988,233 A * | 11/1999 | Fosnight ........... H01L 21/67376 414/217 |
| 10,192,765 B2 * | 1/2019 | Koshti ............. H01L 21/67207 |
| 2009/0129897 A1 * | 5/2009 | Babbs ............... H01L 21/67775 414/217 |
| 2010/0112903 A1 * | 5/2010 | Tu ........................... B24B 57/02 451/36 |
| 2013/0213442 A1 * | 8/2013 | Kaise ................ H01L 21/67393 134/22.18 |

(Continued)

*Primary Examiner* — William M McCalister
(74) *Attorney, Agent, or Firm* — Lowenstein Sandler LLP

(57) ABSTRACT

Disclosed are implementations for efficient purging of substrate carriers (and content held therein) and preventing external contaminants from entering a gas purge apparatus by coupling the gas purge apparatus to a substrate carrier, performing a first gas purging session of an environment of the substrate carrier, receiving a first signal of a first signal type, responsive to receiving the first signal, keeping the gas purge apparatus coupled to the substrate carrier, performing a second gas purging session of the environment of the substrate carrier, receiving a second signal of a second signal type, and, responsive to receiving the second signal, decoupling the purge apparatus from the substrate carrier.

18 Claims, 5 Drawing Sheets

(56) References Cited

U.S. PATENT DOCUMENTS

| | | | |
|---|---|---|---|
| 2015/0147873 A1* | 5/2015 | Moriya | H01L 21/02658 |
| | | | 438/492 |
| 2016/0118279 A1* | 4/2016 | Iyer | H01L 21/67772 |
| | | | 118/715 |
| 2016/0118280 A1* | 4/2016 | Wood | H01L 21/6719 |
| | | | 414/804 |
| 2017/0025298 A1* | 1/2017 | Iwamoto | B08B 5/00 |
| 2019/0326134 A1* | 10/2019 | Suzuki | B05B 1/3013 |
| 2020/0095676 A1* | 3/2020 | Takebayashi | C23C 16/45597 |
| 2020/0114403 A1* | 4/2020 | Iwamoto | H01L 21/67389 |
| 2020/0168488 A1* | 5/2020 | Sunugatov | H01L 21/67201 |
| 2020/0201363 A1* | 6/2020 | Hruzek | G05D 7/0652 |
| 2021/0129170 A1* | 5/2021 | Wei | H01L 21/67017 |
| 2022/0010427 A1* | 1/2022 | Baumgarten | H01L 21/67242 |

\* cited by examiner

PREVENTION OF CONTAMINATION OF SUBSTRATES DURING GAS PURGING

TECHNICAL FIELD

This instant specification generally relates to improving quality of substrates (wafers) in electronic device manufacturing, and, more specifically, to optimizing methods of purging substrate carriers by preventing external contaminants from entering the purge apparatus.

BACKGROUND

Processing of substrates in semiconductor electronic device manufacturing is carried out using a variety of multiple process tools, where substrates travel between various process tools in substrate carriers, such as front opening unified pods. A substrate carrier may be docked to a load port located at a front of an equipment front end module (factory interface), where one or more substrates may be transferred to a load lock chamber or a process chamber (e.g., by a transfer robot). An environmentally-controlled atmosphere may be provided within and between the substrate carrier and the process chambers. Poor control of various environmental factors, such as, e.g., levels of humidity, oxygen, and/or chemical contaminants/particles may adversely affect substrate processing.

SUMMARY

In one implementation, disclosed is a method to couple one or more nozzles of a gas purge apparatus to a substrate carrier and perform, via the one or more nozzles coupled to the substrate carrier, a first gas purging session of an environment of the substrate carrier. The method further includes receiving, by a controller of the gas purge apparatus, a first signal of a first signal type, and, responsive to receiving the first signal, keeping the one or more nozzles coupled to the substrate carrier. The method further includes performing a second gas purging session of the environment of the substrate carrier via the one or more nozzles coupled to the substrate carrier, receiving, by the controller of the gas purge apparatus, a second signal of a second signal type, and responsive to receiving the second signal, decoupling the one or more nozzles from the substrate carrier.

In another implementation, disclosed is a method to receive an indication that one or more nozzles of a gas purge apparatus is coupled to a substrate carrier and output a first instruction to perform a first gas purging session of an environment of the substrate carrier. The method further includes, responsive to determining that a second gas purging session of the environment of the substrate carrier is to be performed, outputting a second instruction to maintain coupling of the one or more nozzles of the gas purge apparatus to the substrate carrier. The method further includes outputting a third instruction to perform a second gas purging session of the environment of the substrate carrier and outputting a fourth instruction to decouple the one or more nozzles from the substrate carrier.

In another implementation, disclosed is a load port assembly that has a purge apparatus to output a flow of gas through a gas delivery nozzle. The load port assembly further has a factory interface coupled to at least one of a load lock chamber, a transfer chamber, or a processing chamber. The factory interface is configured to operatively couple to a substrate carrier. The load port assembly further includes a controller. The controller is configured to cause, via the gas delivery nozzle of the gas purge apparatus, a first gas purging session of an environment of the substrate carrier. The controller is further configured to receive a first signal of a first signal type and, responsive to receiving the first signal, to keep the gas delivery nozzle coupled to the substrate carrier. The controller is further configured to perform a second gas purging session of the environment of the substrate carrier via the one or more nozzles of the gas purge apparatus. The controller is further configured to receive a second signal a second signal type and, responsive to receiving the second signal, decouple the gas delivery nozzle from the substrate carrier.

BRIEF DESCRIPTION OF THE DRAWINGS

Aspects and implementations of the present disclosure will be understood more fully from the detailed description given below and from the accompanying drawings of various aspects and implementations of the disclosure, which, however, should not be taken to limit the disclosure to the specific aspects or implementations, but are for explanation and understanding only. The drawings, described below, are for illustrative purposes and are not necessarily drawn to scale.

DETAILED DESCRIPTION

Figure 1:
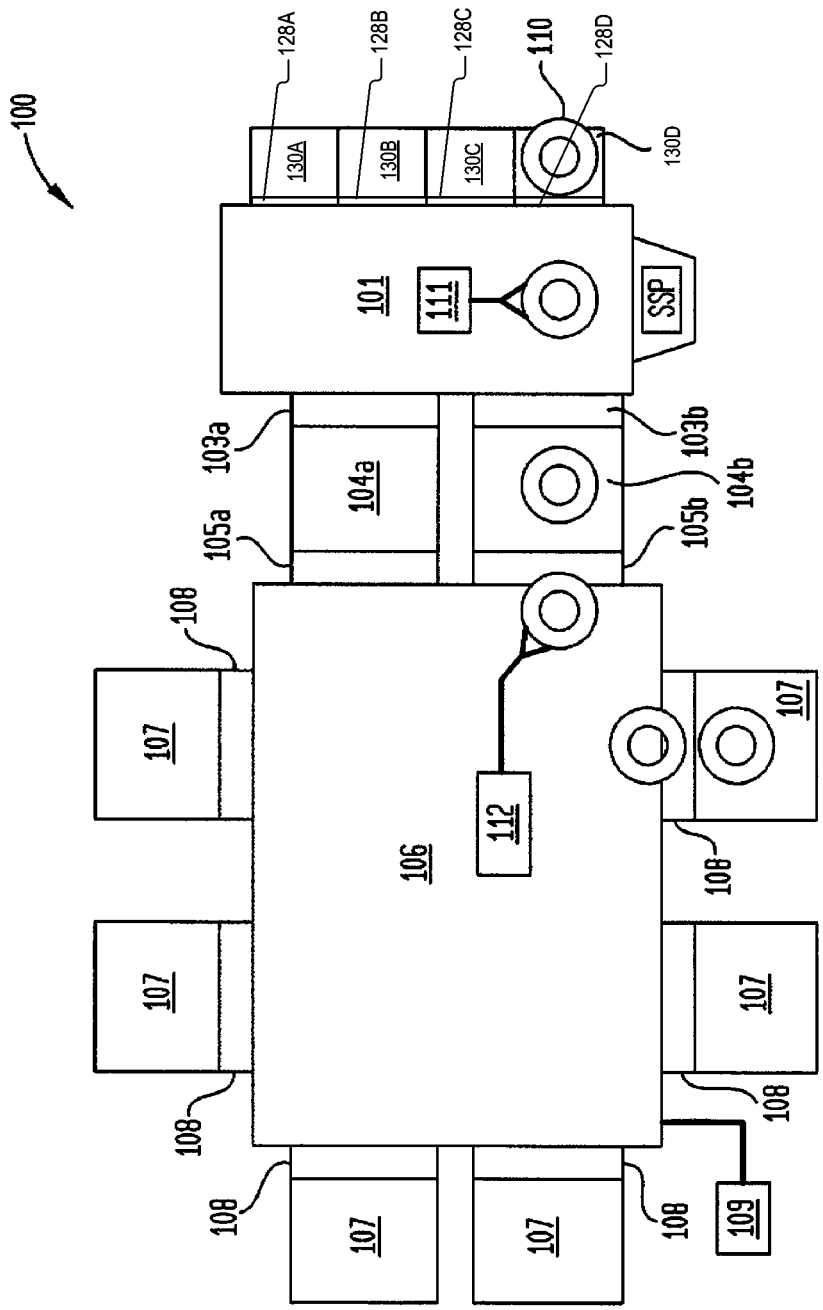
FIG. 1 illustrates a schematic view of a processing system (e.g., a substrate processing system), in accordance with some implementations of the present disclosure.

The implementations disclosed herein provide for optimized control of gas purge apparatuses used in semiconductor substrate manufacturing, in particular to maintain substrate purity while substrates are being held in substrate carriers, such as front opening unified pods (FOUPs). A FOUP may be docked at a factory interface (front-end module) and hold multiple substrates at different stages of substrate processing. A robot (e.g., located in a load lock chamber) may retrieve substrates from the FOUP through a sealable FOUP door for processing in one of the process chambers and, similarly, place fully or partially processed substrates into the FOUP. As substrates are held inside the FOUP, the FOUP environment may be purged using an inert gas (such as nitrogen, neon or other low-reactive gases) to remove undesired contaminants (moisture, oxygen, particles, and the like) than may compromise chemical and physical purity of the substrates. Large FOUPs holding many substrates may require multiple purging sessions to maintain purity therein as the FOUP door (carrier door) is opened and closed to allow transfer of the substrates from and into the FOUP. To perform purging, nozzles of a gas purge apparatus may be coupled to gas ports of the FOUP to purge the FOUP environment, before retracting from the ports to await the next purging session.

The conventional process of gas purging described above has significant disadvantages. Specifically, as the nozzles of the gas purge apparatus disengage from the FOUP ports and the flow of the gas is ceased, the gas in the nozzles is exposed to the atmospheric environment. As a consequence, particles that are present in air (chemical contaminants, oxygen, water, etc.) begin to diffuse into the nozzles, so that when the nozzles re-engage with the FOUP ports, at the start of the next purging session, the diffused contaminants are carried into the FOUP environment and may compromise quality of the substrates held therein. Maintaining the flow of the purging gas through the disconnected nozzles may slow down diffusion of the contaminants but would come with a significant loss of the purging gas. Additionally, maintaining such flow would not prevent diffusion of the contaminants into the gas inlet ports of the FOUP.

Aspects and implementations of the present disclosure address this and other shortcomings of the gas purging technology used in substrate manufacturing. Described herein are, among other things, are implementations capable of preventing contamination of purging gas lines and connectors during periods of purging inactivity. In one implementation, the nozzles of the gas purge apparatus may remain coupled to the gas ports of the FOUP responsive to a controller of the purge apparatus receiving an indication that a second (third, fourth, or any additional) purging operation is upcoming. The indication may of a first type, e.g., "maintain coupling" type) of indication. The indication may be generated by a process controller that controls processing of substrates in one of the process chambers of the processing system. The indication may be generated responsive to the process controller determining that processing of at least one of the substrate held in the FOUP (or in one of the process, transfer, load lock chambers) is not complete and that at least one gas purging session is yet to be performed. In one implementation, after receiving an indication of a second type (e.g., a "FOUP unloading" indication), the controller of the purge apparatus may cause the nozzles to be disengaged from the ports of the FOUP. The second-type indication may be generated by the process controller responsive to the process controller determining that processing of all substrates held in the FOUP is complete and/or that no further gas purging session is upcoming.

FIG. 1 illustrates a schematic view of a processing system 100 (e.g., a substrate processing system), in accordance with some implementations of the present disclosure. The processing system 100 includes a factory interface (FI) 101 and load ports 128 (e.g., load ports 128A-D). In some implementations, the load ports 128A-D are directly mounted to (e.g., sealed against) FI 101. Enclosure systems 130 (e.g., cassette, FOUP, process kit enclosure system, or the like) are configured to removably couple (e.g., dock) to the load ports 128A-D. Referring to FIG. 1, enclosure system 130A is coupled to load port 128A, enclosure system 130B is coupled to load port 128B, enclosure system 130C is coupled to load port 128C, and enclosure system 130D is coupled to load port 128D. In some implementations, one or more enclosure systems 130 are coupled to the load ports 128 for transferring substrates and/or other items into and out of the processing system 100. Each of the enclosure systems 130 may seal against a respective load port 128. In some implementations, a first enclosure system 130A is docked to a load port 128A. Once such operation or operations are performed, the first enclosure system 130A is undocked from the load port 128A, and then a second enclosure system 130 (e.g., a FOUP containing substrate) is docked to the same load port 128A. In some implementations, an enclosure system 130 (e.g., enclosure system 130A) is a system for performing a calibration operation or a diagnostic operation. In some implementations, an enclosure system 130 (e.g., enclosure system 130B) is a process kit enclosure system for transferring content 110 such as process kit rings into and out of the processing system 100.

In some implementations, a load port 128 includes a front interface that forms an opening. The load port 128 additionally includes a horizontal surface for supporting an enclosure system 130. Each enclosure system 130 has a front interface that forms a vertical opening. The front interface of the enclosure system 130 is sized to interface with (e.g., seal to) the front interface of the load port 128 (e.g., the vertical opening of the enclosure system 130 is approximately the same size as the vertical opening of the load port 128). The enclosure system 130 is placed on the horizontal surface of the load port 128 and the vertical opening of the enclosure system 130 aligns with the vertical opening of the load port 128. The front interface of the enclosure system 130 interconnects with (e.g., clamp to, be secured to, be sealed to) the front interface of the load port 128. A bottom plate (e.g., base plate) of the enclosure system 130 has features (e.g., load features, such as recesses or receptacles, that engage with load port kinematic pin features, a load port feature for pin clearance, and/or an enclosure system docking tray latch clamping feature) that engage with the horizontal surface of the load port 128. The same load ports 128 that are used for different types of enclosure systems 130.

In some implementations, the enclosure system 130B (e.g., process kit enclosure system) includes one or more items of content 110 (e.g., one or more of a process kit ring, an empty process kit ring carrier, a process kit ring disposed on a process kit ring carrier, a placement validation wafer, etc.). In some examples, the enclosure system 130B is coupled to FI 101 (e.g., via load port 128) to enable automated transfer of a process kit ring on a process kit ring carrier into the processing system 100 for replacement of a used process kit ring.

In some implementations, the processing system 100 also includes first vacuum ports 103a, 103b coupling FI 101 to respective degassing chambers 104a, 104b. Second vacuum ports 105a, 105b are coupled to respective degassing chambers 104a, 104b and disposed between the degassing chambers 104a, 104b and a transfer chamber 106 to facilitate transfer of substrates and other content 110 (e.g., process kit rings) into the transfer chamber 106. In some implementations, a processing system 100 includes and/or uses one or more degassing chambers 104 and a corresponding number of vacuum ports 103, 105 (e.g., a processing system 100 includes a single degassing chamber 104, a single first vacuum port 103, and a single second vacuum port 105). The transfer chamber 106 includes a plurality of processing chambers 107 (e.g., four processing chambers 107, six processing chambers 107, etc.) disposed therearound and coupled thereto. The processing chambers 107 are coupled to the transfer chamber 106 through respective ports 108, such as slit valves or the like. In some implementations, FI 101 is at a higher pressure (e.g., atmospheric pressure) and the transfer chamber 106 is at a lower pressure (e.g., vacuum). Each degassing chamber 104 (e.g., load lock, pressure chamber) has a first door (e.g., first vacuum port 103) to seal the degassing chamber 104 from FI 101 and a second door (e.g., second vacuum port 105) to seal the degassing chamber 104 from the transfer chamber 106. Content is to be transferred from FI 101 into a degassing chamber 104 while the first door is open and the second door is closed, the first door is to close, the pressure in the degassing chamber 104 is to be reduced to match the transfer chamber 106, the second door is to open, and the content is to be transferred out of the degassing chamber 104. A local center finding (LCF) device is to be used to align the content in the transfer chamber 106 (e.g., before entering a processing chamber 107, after leaving the processing chamber 107).

In some implementations, the processing chambers 107 includes or more of etch chambers, deposition chambers (including atomic layer deposition, chemical vapor deposition, physical vapor deposition, or plasma enhanced versions thereof), anneal chambers, or the like.

Factory interface 101 includes a factory interface robot 111. Factory interface robot 111 includes a robot arm, such as a selective compliance assembly robot arm (SCARA) robot. Examples of a SCARA robot include a 2 link SCARA robot, a 3 link SCARA robot, a 4 link SCARA robot, and so on. The factory interface robot 111 includes an end effector on an end of the robot arm. The end effector is configured to pick up and handle specific objects, such as wafers. Alternatively, or additionally, the end effector is configured to handle objects such as a calibration substrate and process kit rings (edge rings). The robot arm has one or more links or members (e.g., wrist member, upper arm member, forearm member, etc.) that are configured to be moved to move the end effector in different orientations and to different locations.

The factory interface robot 111 is configured to transfer objects between enclosure systems 130 (e.g., cassettes, FOUPs) and degassing chambers 104a, 104b (or load ports). The factory interface robot 111 is taught a fixed location relative to a load port 128 using the enclosure system 130 in implementations. The fixed location in one implementation corresponds to a center location of an enclosure system 130A placed at a particular load port 128, which in implementations also corresponds to a center location of an enclosure system 130B placed at the particular load port 128. Alternatively, the fixed location may correspond to other fixed locations within the enclosure system 130, such as a front or back of the enclosure system 130. The factory interface robot 111 is calibrated using the enclosure system 130 in some implementations. The factory interface robot 111 is diagnosed using the enclosure system 130 in some implementations.

Transfer chamber 106 includes a transfer chamber robot 112. Transfer chamber robot 112 includes a robot arm with an end effector at an end of the robot arm. The end effector is configured to handle particular objects, such as wafers. In some implementations, the transfer chamber robot 112 is a SCARA robot, but may have fewer links and/or fewer degrees of freedom than the factory interface robot 111 in some implementations.

A controller 109 controls various aspects of the processing system 100. The controller 109 is and/or includes a computing device such as a personal computer, a server computer, a programmable logic controller (PLC), a microcontroller, and so on. The controller 109 includes one or more processing devices, which, in some implementations, are general-purpose processing devices such as a microprocessor, central processing unit, or the like. More particularly, in some implementations, the processing device is a complex instruction set computing (CISC) microprocessor, reduced instruction set computing (RISC) microprocessor, very long instruction word (VLIW) microprocessor, or a processor implementing other instruction sets or processors implementing a combination of instruction sets. In some implementations, the processing device is one or more special-purpose processing devices such as an application specific integrated circuit (ASIC), a field programmable gate array (FPGA), a digital signal processor (DSP), network processor, or the like. In some implementations, the controller 109 includes a data storage device (e.g., one or more disk drives and/or solid state drives), a main memory, a static memory, a network interface, and/or other components. In some implementations, the controller 109 executes instructions to perform any one or more of the methods or processes described herein. The instructions are stored on a computer readable storage medium, which include one or more of the main memory, static memory, secondary storage and/or processing device (during execution of the instructions). The controller 109 receives signals from and sends controls to factory interface robot 111 and wafer transfer chamber robot 112 in some implementations.

According to one aspect of the disclosure, to transfer content 110 (e.g., a substrate or a process kit ring) into a processing chamber 107, the content 110 is removed from a process kit enclosure system 130B via factory interface robot 111 located in FI 101. The factory interface robot 111 transfers the content 110 through one of the first vacuum ports 103a, 103b and into a respective degassing chamber 104a, 104b. A transfer chamber robot 112 located in the transfer chamber 106 removes the content 110 from one of the degassing chambers 104a, 104b through a second vacuum port 105a or 105b. The transfer chamber robot 112 moves the content 110 into the transfer chamber 106, where the content 110 is transferred to a processing chamber 107 though a respective port 108. After processing, the processed content 110 (e.g., a used process kit ring) is removed from the processing system 100 in reverse of any manner described herein.

The processing system 100 includes chambers, such as FI 101 (e.g., equipment front end module, EFEM) and adjacent chambers (e.g., load port 128, enclosure system 130, SSP, degassing chamber 104 (such as a loadlock chamber), or the like) that are adjacent to FI 101. Some or all of the chambers can be sealed. In some implementations, inert gas (e.g., one or more of nitrogen, argon, neon, helium, krypton, or xenon) is provided into one or more of the chambers (e.g., FI 101 and/or adjacent chambers) to provide one or more inert environments. In some examples, FI 101 is an inert EFEM that maintains the inert environment (e.g., inert EFEM minienvironment) within FI 101 so that users do not need to enter FI 101 (e.g., the processing system 100 is configured for no manual access within FI 101).

In some implementations, gas flow (e.g., inert gas, nitrogen) is provided into one or more chambers (e.g., FI 101) of the processing system 100. In some implementations, the gas flow is greater than leakage through the one or more chambers to maintain a positive pressure within the one or more chambers. In some implementations, the inert gas within FI 101 is recirculated. In some implementations, a portion of the inert gas is exhausted. In some implementations, the gas flow of non-recirculated gas into FI 101 is greater than the exhausted gas flow and the gas leakage to maintain a positive pressure of inert gas within FI 101. In some implementations, FI 101 is coupled to one or more valves and/or pumps to provide the gas flow into and out of FI 101. A processing device (e.g., of controller 109) controls the gas flow into and out of FI 101. In some implementations, the processing device receives sensor data from one or more sensors (e.g., oxygen sensor, moisture sensor, motion sensor, door actuation sensor, temperature sensor, pressure sensor, etc.) and determines, based on the sensor data, the flow rate of inert gas flowing into and/or out of FI 101.

The enclosure system 130 also allows for teaching, calibrating, and/or diagnosing a robot arm (e.g., of factory interface robot) without opening the sealed environment within FI 101 and adjacent chambers. The enclosure system 130 seals to the load port 128 responsive to being docked on the load port 128. The enclosure system 130 provides purge port access so that the interior of the enclosure system 130 can be purged prior to opening the enclosure system 130 to minimize disturbance of the inert environment within FI 101.

Figure 2:
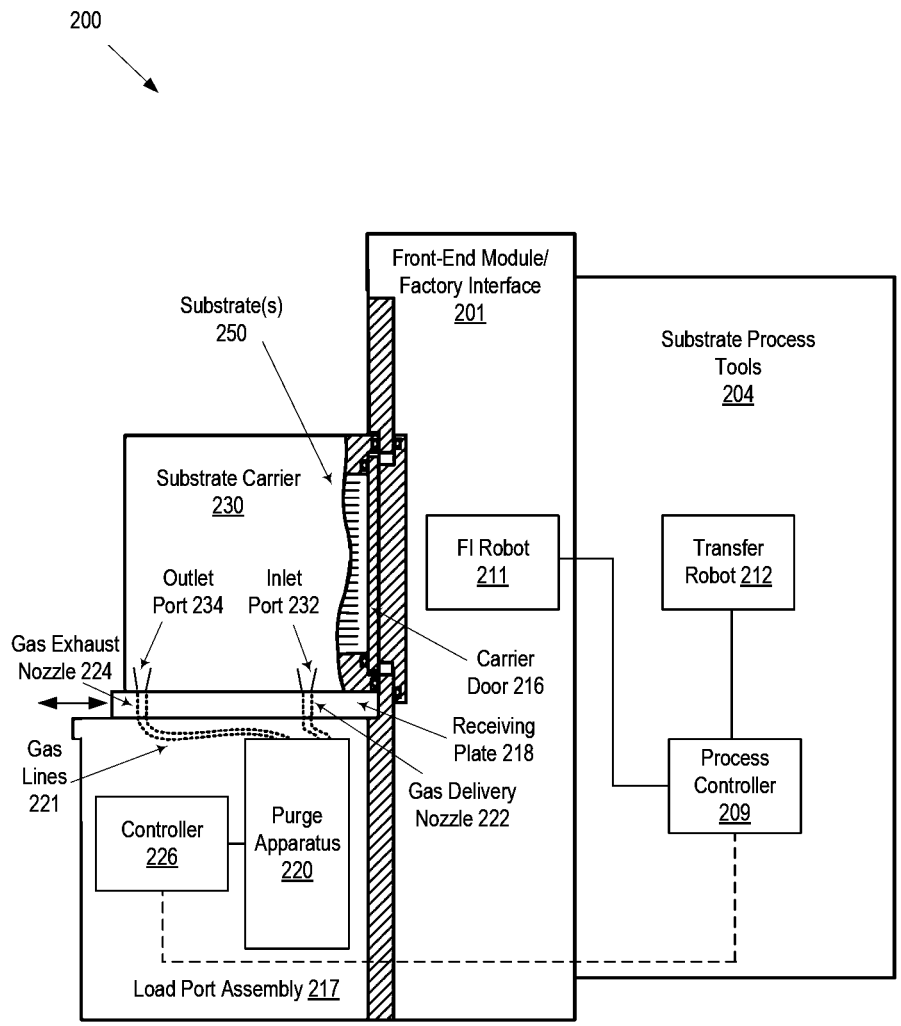
FIG. 2 illustrates a schematic view of another processing system, in accordance with some implementations of the present disclosure.

FIG. 2 illustrates a schematic view of another processing system 200, in accordance with some implementations of the present disclosure. Electronic device processing system 200 includes a substrate carrier 230 (e.g., a FOUP), a load port assembly 217, an equipment front end module (EFEM) or FI 201, and various substrate process tools 204 (such as one or more load lock chambers, one or more transfer chambers, one or more process chambers, and so on). Load port assembly 217 is coupled to FI 201, which is coupled to substrate process tools 204.

Substrate carrier 230 is configured to carry one or more substrates therein. Substrates are any suitable article used to make electronic devices or circuit components, such as silicon-containing discs or wafers, patterned wafers, unpatterned wafers, silicon-containing plates, glass plates, or the like. Substrate carrier 230 is a bottom purge substrate carrier having two or more purge ports (not shown) located therein. In some implementations, substrate carrier 230 is a FOUP.

Load port assembly 217 is configured to receive substrate carrier 230 thereon and includes a carrier door 216 configured to move away to allow the transfer of substrates (and other content) into and out of substrate carrier 230 through an opening by a FI robot 211 (shown as a dotted box) in FI 201.

Load port assembly 217 includes a receiving plate 218 configured to receive and clamp a substrate carrier 230 thereon. Receiving plate 218 has two or more gas nozzles, such as a gas delivery nozzle 222 and a gas exhaust nozzle 224, formed on or extending through receiving plate 218. The gas delivery nozzle 222 is adapted to couple (e.g., connect, engage, attach) to an inlet port 232 of substrate carrier 230 (e.g., located in the bottom of substrate carrier 230, as shown) and the gas exhaust nozzle 224 is adapted to couple to an outlet port 234 of substrate carrier 230. The term "gas nozzle" as used herein means any structure capable of a detachable connection with the purge ports of the substrate carrier 230 enabling gas flow between exhaust and delivery gas lines 221 and an internal chamber of the substrate carrier 230. Several examples of a "gas nozzle" include a tube or hollow protuberance, a port, a hole, and the like. The gas nozzles engage with the inlet/outlet ports of the substrate carrier 230 to form a sealed flow connection there between thus producing a sealed gas flow passageway. Any suitable configuration of nozzles and enabling a rapidly coupled and decoupled configuration may be used. In one implementations, the coupling of nozzles 222 and 224 to ports 232 and 234 is facilitated by a motion of the receiving plate 218, which is movable in, e.g., the horizontal direction, as schematically indicated in FIG. 2 with the double arrow.

Load port assembly 217 also includes a purge apparatus 220 having exhaust and delivery gas lines 221 each connected to a respective gas nozzle 222/224 for purging the substrate carrier 230 coupled to the receiving plate 218 of load port assembly 217. Purge apparatus 220 is connected to a gas source (not shown) and further has an exhaust outlet (not shown). As shown, purge apparatus 220 is located in a lower portion 124 of load port assembly 217.

Along with purge apparatus 220, other devices (not shown), such as, e.g., vacuum pumps, actuators, sensors, gauges, valves, elevator for the carrier door 216, other gas supply lines and sources, and/or the like, are disposed within and/or coupled to electronic device processing system 200 to provide one or more of substrate carrier 230, load port assembly 217, FI 201, and substrate process tools 204 with an environmentally-controlled atmosphere (e.g., in a non-reactive and/or inert gas environment, under vacuum, and the like).

In some implementations, load port assembly 217 further includes a controller 226 that controls the operation of load port assembly 217 including, e.g., clamping and release of substrate carrier 230 to and from receiving plate 218, motion (e.g., docking and undocking motion) of the receiving plate 218, operation of carrier door 216, and operation of purge apparatus 220. Controller 226 may include, e.g., a general purpose computer, a programmable processor, and/or other suitable CPU (central processing unit); a memory for storing processor executable instructions/software programs/firmware; various support circuits (such as, e.g., power supplies, clock circuits, circuits for driving receiving plate 218 and carrier door 216, circuits for opening and closing flow control meters and/or other valves in purge apparatus 220, and/or the like); and input/output circuits for communicating through a GUI to permit entry and display of data, operating commands, and the like by a human operator. In some implementations, controller 226 operates in conjunction with a process controller 209 of the electronic device processing system 200. Controller 226 receives commands from and exchanges information with the process controller 209. Alternatively, in some implementations, control of load port assembly 217 (including purge apparatus 220) is shared by the controller 226 and the process controller 209. In other implementations, load port assembly 217 (including purge apparatus 220) may be completely controlled by the process controller 209 and controller 226 is omitted from load port assembly 217.

The FI 201 is any suitable enclosure having one or more panel openings (load ports) each configured as part of a respective load port assembly 217. FI robot 211 may transfer substrates from substrate carrier 230 through FI 201 to substrate process tools 204, as described in more detail above, in reference to FIG. 1.

Substrate process tools 204 perform one or more processes, such as deposition (e.g., physical vapor deposition (PVD) or chemical vapor deposition (CVD) and the like), etching, annealing, pre-cleaning, heating, degassing, metal or metal oxide removal, and the like, on one or more substrates. Other processes are carried out on substrates therein. Substrate process tools 204 include one or more load lock chambers, a transfer chamber, and one or more process chambers (none shown). The one or more load lock chambers are coupled to FI 201, while the transfer chamber is coupled to the one or more load lock chambers and to the one or more process chambers. The load/unload robot of FI 201 transfers substrates into and out of the one or more load lock chambers, or directly to a process chamber in some implementations. Substrate process tools 204, in some implementations, include a transfer robot (not shown) at least partially housed within the transfer chamber. A transfer robot 212 is used to transfer substrates to and from the one or more load lock chambers and the one or more process chambers.

Figure 3:
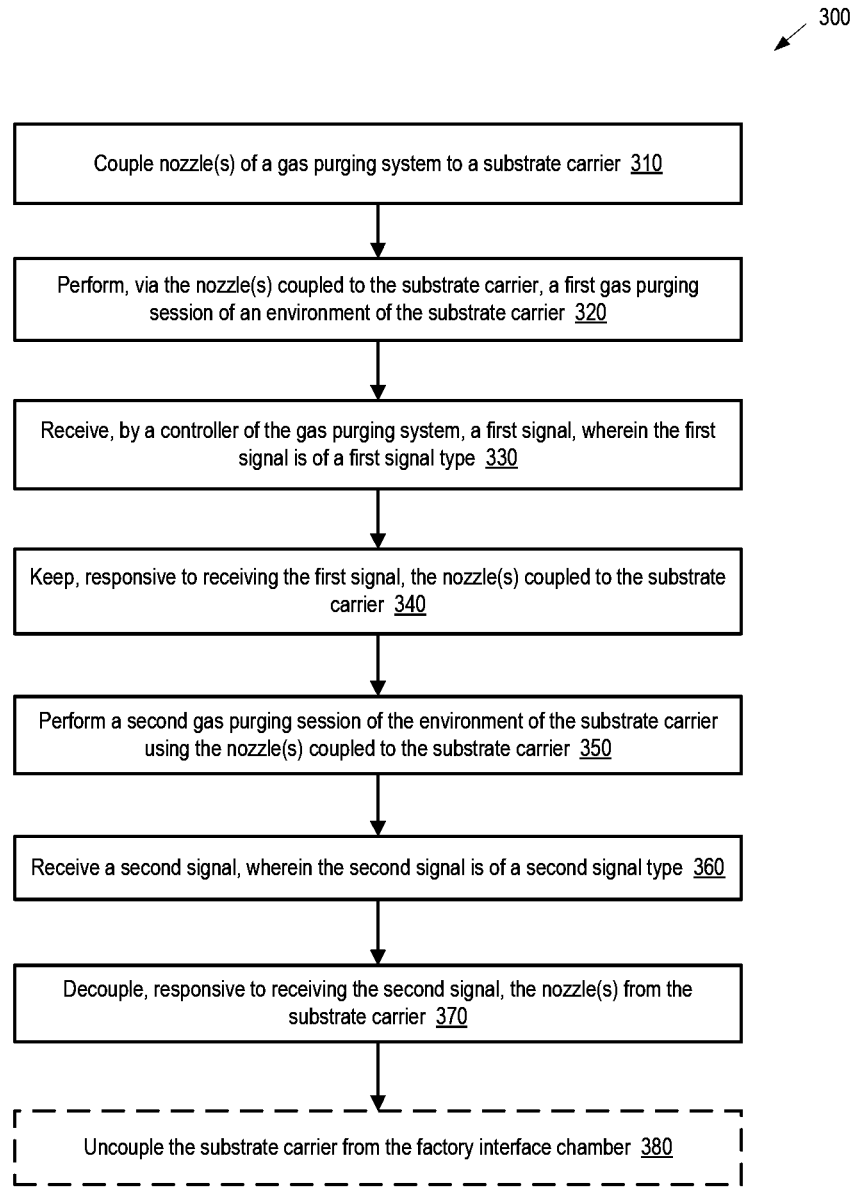
FIG. 3 is a flow diagram of one possible implementation of a method of efficient purging substrate carriers and a content held therein while preventing external contaminants from entering the purge apparatus.

FIG. 3 is a flow diagram of one possible implementation of a method 300 of efficient purging substrate carriers and a content held therein while preventing external contaminants from entering the purge apparatus. In some implementations, method 300 is performed using systems and components shown in FIGS. 1-2 or any combination thereof. In some implementations, method 300 is performed by a logic circuit of the load port assembly 217 and/or the purge apparatus 220. In one implementation, the logic circuit to perform method 300 is the controller 226, such as a central processing unit (CPU), a microprocessor, a DSP, an ASIC, a finite-state machine, an FPGA, and so on. In some implementations, the controller 226 is coupled to a memory device (e.g., a random-access memory, a read-only memory, a flash memory, a static memory, and so on). In some implementations, the controller 226 is executing software or firmware instructions stored in the memory device. In some implementations, the controller 226 is in communication with the process controller 209. The process controller 209 is any logic circuit (e.g., a CPU, a microprocessor, a DSP, an application-specific integrated circuit, a finite-state machine, an FPGA, etc.) capable of controlling various process tools 204, the factory interface robot 211, and/or the transfer robot 212. In some implementations, the process controller 209 outputs instructions to the robots 211 and 212 as well as to other devices and components located within FI 101 or 201, or within the load lock chambers 104, transfer chamber 106, one or more process chambers 107, and so on. In some implementations, the process controller 209 is capable of outputting a variety of instructions, such as to open the carrier door 216, operate the FI robot 211 to extract a substrate 250 from the substrate carrier 230 and transport the substrate 250 to the load lock chamber 104a (or 104 b), operate the transfer robot 212 to pick up the substrate 250 from the load lock chamber 104 and transport the substrate 250 into one of the process chambers 107, and the like. In some implementations, the process controller 209 output instructions to perform one or more substrate processing operations (e.g., deposition, etching, plasma-enhanced substrate manufacturing, and so on) on the substrate 250 in the process chambers 107. In some implementations, the process controller 209 is to output instruction to return the processed substrate 250 into the substrate carrier 230 using operations that are in an order that is the reverse order from the above-listed operations.

The process controller 209 is in communication with the controller 226, in some implementations. The communication can be over a bus connection, a network connection, a wired connection, a wireless connection, etc. A wireless connection, if implemented, is facilitated by a radio circuit (having a radio front end, amplifiers, digital-to-analog and analog-to-digital convertors, etc.) on the process tools side and a radio circuit on the load port/purge apparatus side. In some implementations, the process controller 209 is communicating, to the controller 226, indications of a particular stage of processing that one or more substrates 250 are undergoing. In some implementations, the controller 226, based on the received indications (and the instructions stored in the memory device coupled to the controller 226), control operations of the purge apparatus 220, including initiation and completion of gas purging sessions, decoupling of nozzles 224/225 from the ports 232/234, and so on. In some implementations, the processing system (e.g., the system 100 or the system 200) has a single controller (which can be controller 226, controller 209, or some combination thereof) that combines the functionality of the controller 226 and the process controller 209, as described in more detail below.

Some of the blocks of method 300 may be optional. Some or all blocks of the method 300 may be performed (e.g., by controller 229) responsive to instructions from the process controller 209.

At block 310, the processing device carrying out method 300 performs a first gas purging session of an environment of the substrate carrier. In some implementations, the substrate carrier has one or more content items therein. In some implementations, a content item is a substrate. In some implementations, a content item is a process kit ring (such as a reflecting edge ring to illuminate and heat up the bottom surface of a substrate during the substrate processing in a process chamber. In some implementations, a content item is a calibration device or an inspection device (which may be shaped as a substrate, for the ease of handling by the robots of the processing system), and so on. In some implementations, multiple different types of content items are held within a single substrate carrier. The content items held by the substrate carrier, generally, may be at various stages of processing. For example, some substrates are awaiting processing, some substrates have already undergone some (but not all) processing, while some substrates have undergone all processing and are awaiting unloading.

In various implementations, the substrate carrier is adapted to couple to the factory interface, such as FI 101 or 201. The FI has a FI robot 211 capable of retrieving a content item from the substrate carrier and delivering the content item into one of the chambers coupled to FI. In some implementations, FI is coupled to at least one of a load lock chamber 104, a transfer chamber 106, or a processing chamber 107. As the substrate carrier is docked at FI and, the substrate carrier door (e.g., the carrier door 216) is sealed against FI. As a result, when the carrier door is opened or moved aside (e.g., by a motor of FI), the environment inside the substrate carrier is not exposed to the atmosphere present outside the substrate carrier and/or FI. Concurrently or after docking of the substrate carrier at FI, one or more nozzles of the gas purge apparatus become coupled to the substrate carrier. For example, a gas delivery nozzle (e.g., nozzle 222) of the gas purge apparatus becomes aligned with a gas inlet port (e.g., port 232) of the substrate carrier. Similarly, the gas exhaust nozzle (e.g., nozzle 224) of the gas purge apparatus becomes aligned with the gas outlet port (e.g., port 234) of the substrate carrier.

In some implementations, a motion of the receiving plate (e.g., the receiving plate 218) facilitates coupling of the gas intake nozzle or the gas exhaust nozzle (or both) to the respective ports of the substrate carrier. In some implementations, the receiving plate houses the gas delivery nozzle and/or the gas exhaust nozzle. In some implementations, the gas delivery nozzle and/or the gas exhaust nozzle are formed on or extending through the receiving plate and are adapted to couple (connect, engage, seal) to the inlet and the outlet ports of the substrate carrier. The coupling between the nozzles and the ports is such as to facilitate a sealed flow connection of the purge gas (e.g., an inert gas) between the purge apparatus and an environment of the substrate carrier.

Upon establishment of a sealed connection between FI and the substrate carrier (and between the gas nozzles of the purge apparatus and the substrate ports), method 300 continues at block 320 with performing, via the gas nozzles coupled to the substrate carrier, a first gas purging session of the environment of the substrate carrier. In some implementations, the first gas purging session is performed automatically upon detecting that the sealed connection is established. In other implementations, the first gas purging session is initiated (e.g., by the controller 226) in response to an external instruction (for example, received from the process controller 209, or from a human operator). In some implementations, the first gas purging session is initiated upon a determination (made by the controller 226, the process controller 209, some outside processing device, or a human operator) that the environment inside the substrate carrier is more contaminated (or less contaminated) than the environment in FI (or in one of the chambers coupled, directly or indirectly, to FI).

It shall be understood that throughout this disclosure the terms "first" and "second" (e.g., a first purging session, a second purging session, a first signal, a second signal, and the like) are used as identifiers for the respective entities (e.g., sessions, signals) and are not meant to limit the implementations to only two such entities. In various implementations, there can be more than two purging sessions (and more than two signals). For example, in some implementations, the first gas purging session is not the earliest gas purging session for the substrate carrier and an arbitrary number (e.g., one, two, three, etc.) of purging sessions can be performed prior to the first gas purging session. Similarly, in some implementations, the second gas purging session is not the last gas purging session for the substrate carrier and an arbitrary number of purging sessions (third, fourth, etc.) can be performed after the second gas purging session. Some or all of the earlier or later purging sessions can be performed responsive to instructions from the controller 226. Some or all of the earlier or later purging sessions can be performed responsive to instructions from the process controller 209.

At block 330, the processing device performing method 300 receives a first signal. In some implementations, the first signal is received from a logic circuit of the substrate process tools (e.g., from the process controller 209). In some implementations, the first signal is of a first signal type communicating to the processing device that an additional (e.g., second, third, etc.) purging session—to be performed on the same substrate carrier—are upcoming. "Signal" means any electric, magnetic, mechanical, and the like, carrier—analog or digital—of information that is capable of reaching the processing device in a format accessible to said device. In some implementations, the first (second, third, etc., as describe below) signal is output by an external computing device. In some implementations, however, the first (second, third, etc.) signal may be produced and received by the same processing device. For example, the combined controller, which combines functions of the controller 226 and the process controller 209, performs a computation producing a determination that an additional purging session is upcoming. Such a determination, stored in one of the internal memory buffers (e.g., in cache) of the processing device (controller 226, combined controller) or in one of the external memory devices accessible to the processing device is subsequently (or concurrently) retrieved (as a "signal") by the same processing device making a determination what instruction to output to the purge apparatus. The first signal may be a "hold" signal, a "standby" signal, a "maintain state" signal, or any other similar signal.

At block 340, the processing device, responsive to receiving the first signal, generates a command to the purge apparatus to keep the nozzle(s) of the gas purge apparatus coupled to the substrate carrier. By preventing disengagement (decoupling) of the nozzle(s), the method 300 ensures that no contaminants enter the nozzles and the lines of the purge system (or the ports of the substrate carrier) during a period of purging inactivity.

At block 350, the method 300 continues with performing a second gas purging session of the environment of the substrate carrier via the nozzle(s) coupled to the substrate carrier. In some implementations, the second gas purging session occurs after a pre-set time interval since the commencement (or completion) of the first gas purging session. In some implementations, the second gas purging session occurs upon instructions from the process controller. In some implementations, the second gas purging session occurs after a pre-determined number of content items of the substrate carrier have been processed. In some implementations, the second gas purging session occurs after various substrate process tools of the processing system have performed a pre-determined number of operations (transfers, depositions, etchings, etc.)

At block 360, the processing device performing method 300 receives a second signal, In some implementations, the second signal is received from the logic circuit of the substrate process tools (e.g., from the process controller 209). In some implementations, the second signal is of a second signal type communicating to the processing device that no additional purging sessions are upcoming. In some implementations, the second signal is produced and received by the same processing device. The second signal may be a "stop" signal, a "complete" signal, an "unload" signal, or any other similar signal. In some implementations, the second signal is output even if not all processing of the substrates of the substrate carrier is complete, but when it is determined that no purging session is to occur within a pre-determined amount of time (e.g., 15 minutes, in an exemplary implementation). In some implementations, the second signal is subsequent (later in time) to the first signal. In some implementations, the second signal precedes the first signal. For example, in some implementations, it is determined that only one purging session is to be performed, so that the only signal received by the controller of the purge apparatus is a signal of the second type—"disengage" or "unload."

At block 370, the processing device performing method 300, responsive to receiving the second signal, outputs instructions to the purge apparatus to decouple the nozzle(s) from the substrate carrier. This causes the motor of the purge apparatus, in one implementations, to move the receiving plate to disengage the nozzles of the purge apparatus from the ports of the substrate carrier. In some implementations, at an optional block 380, the method 300 continues with uncoupling the substrate carrier from the factory interface responsive to decoupling the nozzle(s) from the substrate carrier. For example, following completion of all scheduled processing operations (and uncoupling of the purge apparatus from the substrate carrier), the substrate carrier may be ready to be shipped to a customer, moved to a different manufacturing machine, and so on.

Figure 4:
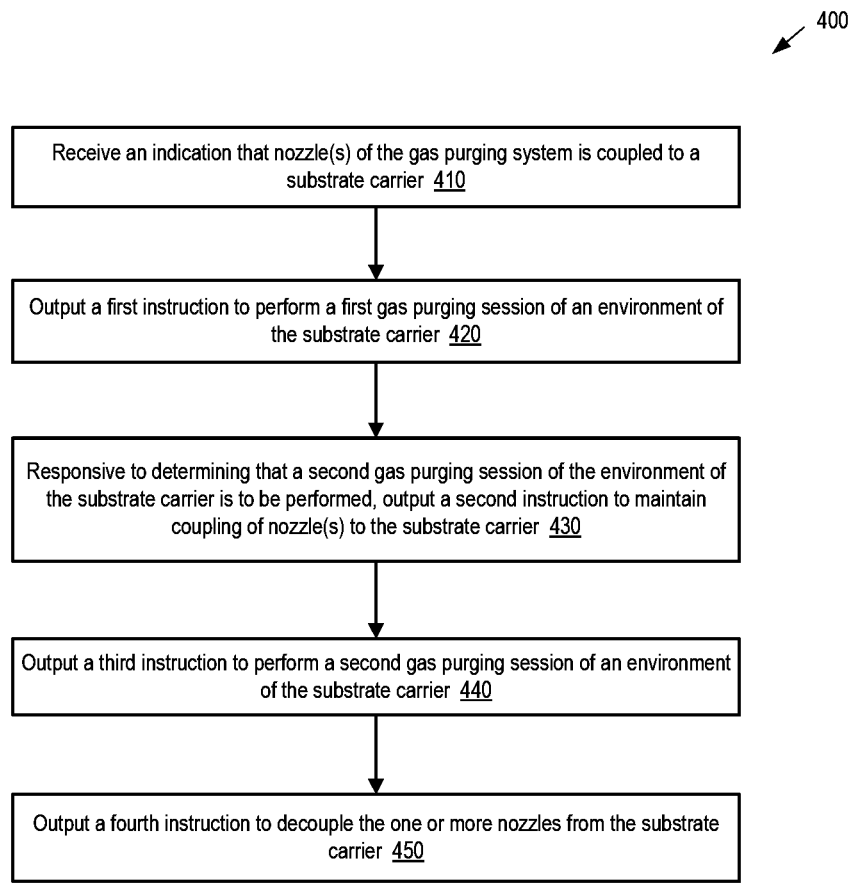
FIG. 4 is a flow diagram of another possible implementation of a method of efficient purging substrate carriers and a content therein while preventing external contaminants from entering the purge apparatus.

FIG. 4 is a flow diagram of another possible implementation of a method of efficient purging substrate carriers and a content therein while preventing external contaminants from entering the purge apparatus. In some implementations, method 400 depicted in FIG. 4 is performed using systems and components shown in FIGS. 1-2 or any combination thereof. In some implementations, method 400 is performed by the process controller 209. In some implementations, the process controller 209 is in communication with the controller 226. In some implementations, the processing system (e.g., the system 100 or the system 200) has a single controller (e.g., controller 209) that combines the functionality of the controller 226 and the process controller 209. In some implementations, some of the blocks of method 400 are optional.

At block 410, the processing device carrying out method 400 receives an indication that nozzles of the gas purge apparatus are coupled to the substrate carrier. For example, in one implementation, the processing device (process controller 209) receives such indication from the controller 226 of the purge apparatus 220, the indication being generated responsive to the receiving plate 218 sealing the nozzles of the purge apparatus to the gas ports of the substrate carrier.

At block 420, method 400 continues with the processing device outputting (e.g., to the purge apparatus 220 or the controller 226) a first instruction to perform a first gas purging session of the environment of the substrate carrier. In some implementations, the first gas purging session is not the earliest gas purging session for the substrate carrier. For example, the earliest purging session may be a purging session that starts automatically upon coupling of the purging nozzles to the substrate carrier, without involvement of the process controller 209. In such implementations, "first purging session" is a first session that is performed responsive to instructions from the process controller. In some instances, "first purging session" denotes any session performed responsive to the instructions from the controller 226 (regardless of the actual order of the session in the sequence of purging sessions). In some implementations, the first instruction is output after the carrier door is opened for the first time. In some implementations, the first instruction is output after a first content item is returned to the substrate carrier (e.g., after processing of the first content item).

At block 430, method 400 continues with the processing device outputting a second instruction. The second instruction is to maintain coupling of the nozzle(s) of the gas purge apparatus to the substrate carrier, to prevent contamination of the inert gas within the nozzles of the purge system and/or ports of the substrate carrier. In some implementations, the second instruction is output responsive to determining that a second gas purging session of the environment of the substrate carrier is to be performed. For example, the processing device determines that additional content items (e.g., substrates, process kit rings, calibration devices, etc.) are yet to be processed and/or placed/returned to the substrate carrier. The second instruction can be a "hold" instruction, a "standby" instruction, a "maintain state" instruction, or any other similar instruction. In some implementations, the output second instruction is communicated to the processing device (e.g. controller 229) of the load port assembly/purge apparatus in the form of a signal, as described above, in relation to blocks 330 and 360 of method 300. In some implementations, block 430 is performed concurrently or even prior to block 420.

At block 440, method 400 continues with the processing device outputting a third instruction to perform a second gas purging session of the environment of the substrate carrier. For example, after the first purging session, one or more operations are performed in a load lock chamber, a transfer chamber, or a processing chamber on one or more content items of the substrate carrier (or other content items that were not originally inside the substrate carrier). Responsive to such operations, the processing device outputs the third instruction, and the purge apparatus performs the second gas purging session. In some instances, "second purging session" refers to any session performed after the first purging session (regardless of the number of intervening sessions that have been carried out in the meantime).

At block 450, method 400 continues with the processing device outputting a fourth instruction to decouple the nozzle(s) from the substrate. In some implementations, the fourth instruction is responsive to determining that no operation will be performed on (any) content item that is held inside the substrate carrier (or about to be transported to the substrate carrier by various robots of the processing system). In some implementations, the fourth instruction is to decouple the nozzle(s) of the gas purge apparatus from the substrate carrier. The fourth instruction can be a "stop" instruction, a "complete" instruction, an "unload" instruction, or any other similar instruction. In some implementations, the output fourth instruction is communicated to the processing device (e.g. controller 229) of the load port assembly/purge apparatus in the form of a signal, as described above, in relation to method 300. In some implementations, block 450 is performed concurrently or even prior to block 440.

Figure 5:
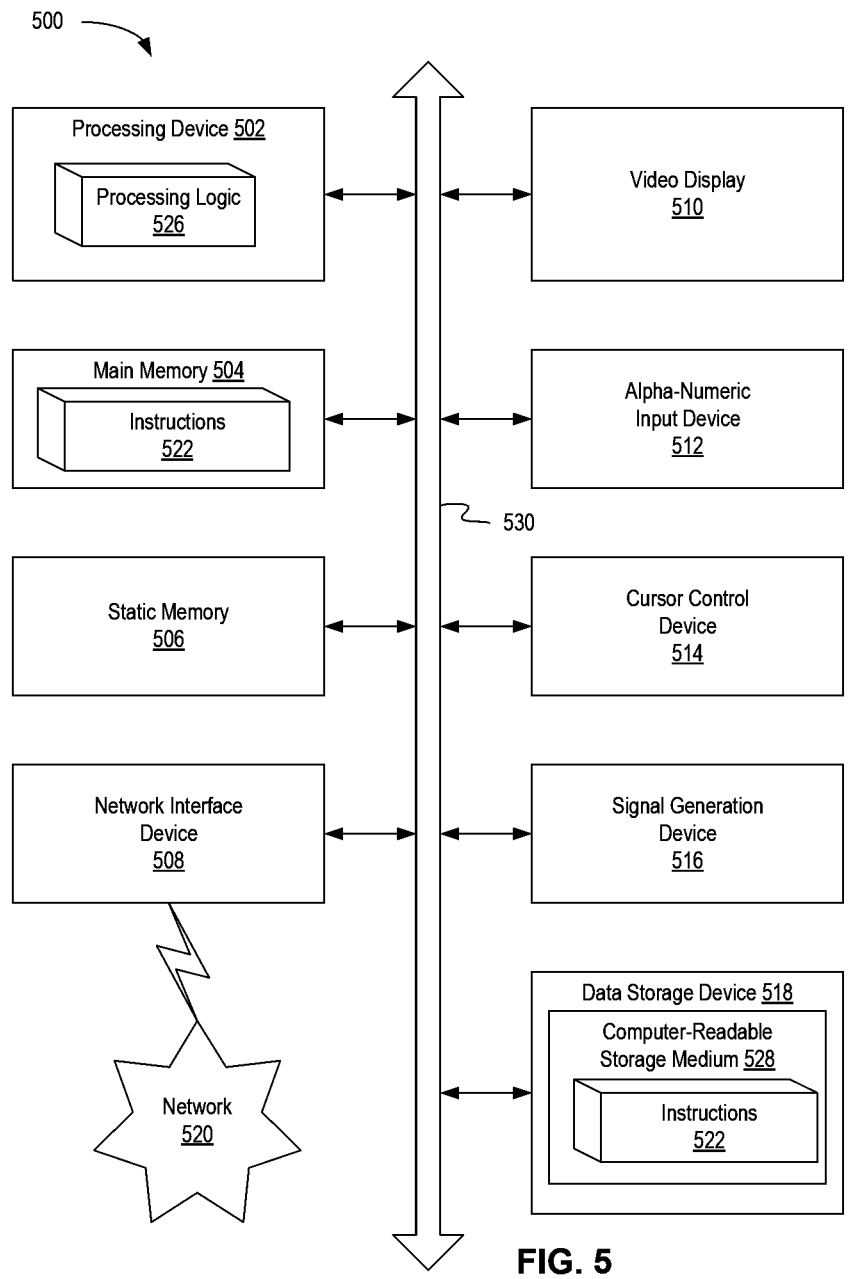
FIG. 5 depicts a block diagram of an example processing system capable of supporting real-time detection of particulate contaminants present inside a deposition chamber, based on light scattering data.

FIG. 5 depicts a block diagram of an example processing device 500 operating in accordance with one or more aspects of the present disclosure. The processing device 500 may be the controller 226 that performs method 300 of FIG. 3, or the process controller 204 that performs method 400 of FIG. 4, or a combined controller capable of performing both methods 300 and 400, in some implementations.

Example processing device 500 may be connected to other processing devices in a LAN, an intranet, an extranet, and/or the Internet. The processing device 500 may be a personal computer (PC), a set-top box (STB), a server, a network router, switch or bridge, or any device capable of executing a set of instructions (sequential or otherwise) that specify actions to be taken by that device. Further, while only a single example processing device is illustrated, the term "processing device" shall also be taken to include any collection of processing devices (e.g., computers) that individually or jointly execute a set (or multiple sets) of instructions to perform any one or more of the methods discussed herein.

Example processing device 500 may include a processor 502 (e.g., a CPU), a main memory 504 (e.g., read-only memory (ROM), flash memory, dynamic random access memory (DRAM) such as synchronous DRAM (SDRAM), etc.), a static memory 506 (e.g., flash memory, static random access memory (SRAM), etc.), and a secondary memory (e.g., a data storage device 518), which may communicate with each other via a bus 530.

Processor 502 represents one or more general-purpose processing devices such as a microprocessor, central processing unit, or the like. More particularly, processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. In accordance with one or more aspects of the present disclosure, processor 502 may be configured to execute instructions implementing methods 300 and 400 of efficient purging substrate carriers while preventing external contaminants from entering the purge apparatus.

Example processing device 500 may further comprise a network interface device 508, which may be communicatively coupled to a network 520. Example processing device 500 may further comprise a video display 510 (e.g., a liquid crystal display (LCD), a touch screen, or a cathode ray tube (CRT)), an alphanumeric input device 512 (e.g., a keyboard), an input control device 514 (e.g., a cursor control device, a touch-screen control device, a mouse), and a signal generation device 516 (e.g., an acoustic speaker).

Data storage device 518 may include a computer-readable storage medium (or, more specifically, a non-transitory computer-readable storage medium) 528 on which is stored one or more sets of executable instructions 522. In accordance with one or more aspects of the present disclosure, executable instructions 522 may comprise executable instructions implementing methods 300 and 400 of efficient purging of substrate carriers while preventing external contaminants from entering the purge apparatus.

Executable instructions 522 may also reside, completely or at least partially, within main memory 504 and/or within processing device 502 during execution thereof by example processing device 500, main memory 504 and processor 502 also constituting computer-readable storage media. Executable instructions 522 may further be transmitted or received over a network via network interface device 508.

While the computer-readable storage medium 528 is shown in FIG. 5 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

It should be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

The implementations of methods, hardware, software, firmware or code set forth above may be implemented via instructions or code stored on a machine-accessible, machine readable, computer accessible, or computer readable medium which are executable by a processing element. "Memory" includes any mechanism that provides (i.e., stores and/or transmits) information in a form readable by a machine, such as a computer or electronic system. For example, "memory" includes random-access memory (RAM), such as static RAM (SRAM) or dynamic RAM (DRAM); ROM; magnetic or optical storage medium; flash memory devices; electrical storage devices; optical storage devices; acoustical storage devices, and any type of tangible machine-readable medium suitable for storing or transmitting electronic instructions or information in a form readable by a machine (e.g., a computer).

Reference throughout this specification to "one implementation" or "an implementation" means that a particular feature, structure, or characteristic described in connection with the implementation is included in at least one implementation of the disclosure. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of implementation, implementation, and/or other exemplarily language does not necessarily refer to the same implementation or the same example, but may refer to different and distinct implementations, as well as potentially the same implementation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" or "an implementation" or "one implementation" throughout is not intended to mean the same implementation or implementation unless described as such. Also, the terms "first," "second," "third," "fourth," etc. as used herein are meant as labels to distinguish among different elements and may not necessarily have an ordinal meaning according to their numerical designation.

What is claimed is:

1. A method comprising:
    coupling one or more nozzles of a gas purge apparatus to a substrate carrier;
    performing, via the one or more nozzles coupled to the substrate carrier, a first gas purging session of an environment of the substrate carrier;
    receiving, by a controller of the gas purge apparatus, a first signal, wherein the first signal is of a first signal type;
    responsive to receiving the first signal, keeping the one or more nozzles coupled to the substrate carrier;
    performing a second gas purging session of the environment of the substrate carrier via the one or more nozzles coupled to the substrate carrier;
    receiving, by the controller of the gas purge apparatus, a second signal, wherein the second signal is of a second signal type; and
    responsive to receiving the second signal, decoupling the one or more nozzles from the substrate carrier.

2. The method of claim 1, wherein the environment of the substrate carrier comprises one or more content items, wherein the one or more content items comprise one of a substrate or a process kit ring.

3. The method of claim 1, wherein the substrate carrier is adapted to couple to a factory interface, wherein the factory interface is coupled to at least one of a load lock chamber, a transfer chamber, or a processing chamber.

4. The method of claim 1, wherein coupling the one or more nozzles of the gas purge apparatus to the substrate carrier comprises:
aligning a gas delivery nozzle of the gas purge apparatus with a gas inlet port of the substrate carrier; and
aligning a gas exhaust nozzle of the gas purge apparatus with a gas outlet port of the substrate carrier.

5. The method of claim 1, wherein the one or more nozzles of the gas purge apparatus comprise a gas delivery nozzle and a gas exhaust nozzle, and wherein coupling the one or more nozzles of the gas purge apparatus to the substrate carrier is facilitated by motion of a receiving plate, wherein the receiving plate houses the gas delivery nozzle and the gas exhaust nozzle.

6. The method of claim 1, wherein the first signal and/or the second signal is output by a process controller, wherein the process controller is to control one or more substrate processing operations.

7. The method of claim 6, wherein a first substrate processing operation of the one or more substrate processing operations comprises transferring a substrate from the substrate carrier to a factory interface.

8. The method of claim 7, wherein a second substrate processing operation of the one or more substrate processing operations comprises transferring the substrate from the factory interface to a processing chamber.

9. The method of claim 1, wherein the second signal is received later in time than the first signal.

10. The method of claim 1, wherein performing the first gas purging session is responsive to coupling the one or more nozzles of a gas purge apparatus to the substrate carrier.

11. The method of claim 1, wherein the first signal type is to indicate that an instruction to perform the second gas purging session is upcoming.

12. The method of claim 11, wherein the second signal type is to indicate that no instructions to perform additional purging sessions are upcoming.

13. The method of claim 1, further comprising, prior to coupling the one or more nozzles of the gas purge apparatus, coupling the substrate carrier to a factory interface.

14. The method of claim 13, further comprising, responsive to decoupling the one or more nozzles from the substrate carrier, uncoupling the substrate carrier from the factory interface.

15. A method comprising:
receiving an indication that one or more nozzles of a gas purge apparatus are coupled to a substrate carrier, outputting a first instruction to perform a first gas purging session of an environment of the substrate carrier;
responsive to determining that a second gas purging session of the environment of the substrate carrier is to be performed, outputting a second instruction to maintain coupling of the one or more nozzles of the gas purge apparatus to the substrate carrier;
outputting a third instruction to perform a second gas purging session of the environment of the substrate carrier; and
outputting a fourth instruction to decouple the one or more nozzles from the substrate carrier.

16. The method of claim 15, wherein outputting the first instruction to perform the first gas purging session is responsive to coupling of the substrate carrier to a factory interface.

17. The method of claim 15, wherein outputting the third instruction to perform the second gas purging session is responsive to an operation performed in a load lock chamber, a transfer chamber, or a processing chamber.

18. The method of claim 15, wherein outputting the fourth instruction to decouple the one or more nozzles from the substrate carrier is responsive to determining that no operation will be performed on a content item inside the substrate carrier.

* * * * *